United States Patent [19]

Nozaki et al.

[11] Patent Number: 4,500,744
[45] Date of Patent: Feb. 19, 1985

[54] PHOTOVOLTAIC DEVICE

[75] Inventors: Hidetoshi Nozaki, Yokohama; Takaaki Kamimura, Kawasaki; Tamothu Hatayama, Matsudo; Tadashi Utagawa, Yokohama, all of Japan

[73] Assignee: Tokyo Shibaura Denki Kabushiki Kaisha, Kawasaki, Japan

[21] Appl. No.: 513,390

[22] Filed: Jul. 13, 1983

[30] Foreign Application Priority Data

Jul. 16, 1982 [JP] Japan ................... 57-122940

[51] Int. Cl.³ .............................................. H01L 31/06
[52] U.S. Cl. ...................................... 136/258; 357/30; 136/255
[58] Field of Search ............ 136/258 AM, 255; 357/2, 357/30

[56] References Cited

FOREIGN PATENT DOCUMENTS 56-88377 7/1981 Japan ..................... 136/258 AM

OTHER PUBLICATIONS

*Japanese J. Appl. Phys.*, vol. 20, pp. L183–L186, (1981).

Primary Examiner—Aaron Weisstuch
Attorney, Agent, or Firm—Oblon, Fisher, Spivak, McClelland & Maier

[57] ABSTRACT

A photovoltaic device comprises a transparent substrate, an amorphous silicon layer structure of a p-i-n type formed on the substrate and comprised of a p-layer, i-layer and n-layer, and an electrode formed on the amorphous silicon layer structure, wherein either the p-layer and n-layer of the amorphous silicon layer structure, on which light is incident is constituted such that its optical forbidden band gap is greater on the i-layer side than on the substrate side.

15 Claims, 5 Drawing Figures

F I G. 4
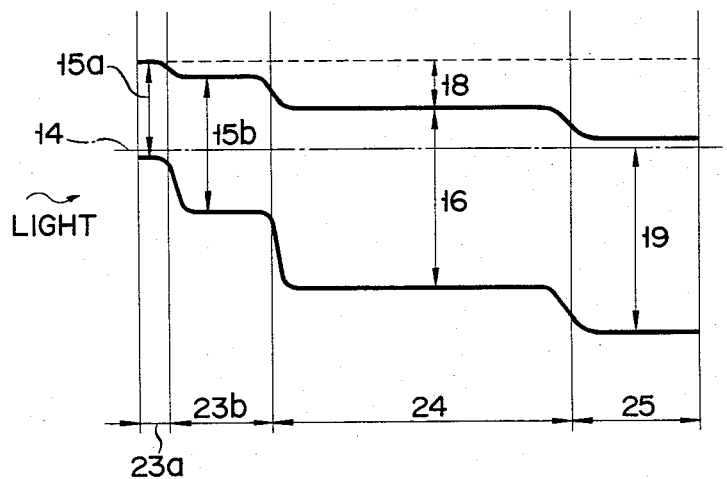
F I G. 5
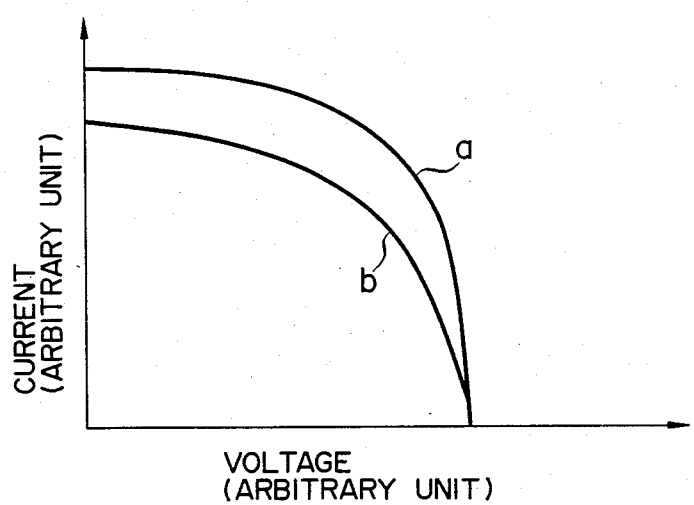

PHOTOVOLTAIC DEVICE

BACKGROUND OF THE INVENTION

This invention relates to a photovoltaic device such as a solar cell and photo detector.

Recently, a method has been proposed which mass-produces low-priced solar cells by using amorphous silicon (hereinafter referred to as an "a-Si") as a semiconductor material. The a-Si is formed by decomposing, for example, silane or fluoro-silane in a glow discharge. Since the average density of the localized states of the a-Si in the forbidden band is low, below $10^{17}$ $eV^{-1}cm^{-3}$, a shift of the Fermi-level is readily effected by doping an impurity into the a-Si structure. For this reason, the a-Si is preferably used as a semiconductor material for solar cells.

FIG. 1 is an energy band diagram of a p-i-n type solar cell comprised of a-Si. In the diagram, as shown in FIG. 1, regions 11, 12 and 13 show p-, i- and n-type layers. Level 14 is the Fermi-level and gaps 15, 16 and 17 are the optical forbidden band gaps (hereinafter referred to as "Eg's") of these layers 11, 12 and 13, respectively. Gap 18 represents a diffusion potential.

When light is incident on the p-layer, electron-hole pairs are produced in a depletion layer of the i-type layer and migrate in opposite directions due to the diffusion potential, causing them to be captured by a pair of opposite electrodes to produce an electromotive force.

In a solar cell of this type, the thicker the p-type layer, the higher the diffusion potential of the p-i junction becomes, thus increasing the open circuit bolt Voc. However, if the p-type layer is too thick, the recombination of carriers in the p-type layer is increased and the amount of light reaching the i-type layer is decreased, causing a decrease in the short circuit current density Jsc. The thickness of the p-type layer is normally at most 200 Å. The thickness of the i-type layer permitting the production of the electron-hole pairs is designed to have a value of, for example, about 5000 Å which substantially corresponds to the sum of the value of the width of the diffusion potential region and the diffusion length of the minority carriers. It is important that, since the region permitting the generation of photocurrent exists mostly in the i-type layer, the absorption of light in the p-type layer be decreased. A method has been considered which expands the Eg of the p-type layer, thereby permitting the entry of light. The Eg of the p-type layer can be made above 1.8 eV, for example, by controlling the conditions under which the glow discharge occurs, for example, in the formation of an a-Si layer structure. Where the p-type layer having such an Eg level is used, it is impossible to obtain an adequate open circuit voltage Voc unless the thickness of the p-type layer is made 200 to 300 Å or more. The reason is that with an increase in Eg the activation energy of the a-Si layer structure increases, thereby causing the diffusion potential to decline.

FIG. 2 is a graph showing the relationship of the thickness of the p-type layer to the Voc. In FIG. 2, the curve a denotes a p-type layer of a smaller Eg level obtained by the decomposition of a 1.0 molar % $B_2H_6$-bearing $SiH_4$ in a glow discharge and the curve b denotes a p-type layer of a greater Eg level obtained by the decomposition of a 0.05 molar % $B_2H_6$-bearing $SiH_4$ in a glow discharge. From FIG. 2 it is evident that an inadequate voltage Voc is obtained unless the p-type layer has a greater thickness.

It is possible that the absorption of light in the p-type layer is decreased by reducing the thickness of the p-type layer while making the Eg level lower. In this case, however, a non-uniform a-Si layer structure is formed and the formation of the pi junction is inadequate, lowering the fill factor of the solar cell.

SUMMARY OF THE INVENTION

It is accordingly an object of this invention to provide a photovoltaic device which has a high open circuit voltage, high short circuit current density and high conversion efficiency.

A photovoltaic device of this invention comprises a transparent substrate, an amorphous silicon layer structure of a p-i-n type formed on the substrate and comprised of a p-layer, i-layer and n-layer, and an electrode formed on the amorphous silicon layer structure. Either p-layer or n-layer on which light is incident is chosen such that the optical forbidden band gap is greater on the i-layer side than on the substrate side.

According to this invention, the a-Si is intended to include hydrogenated amorphous silicon and hydrogenated amorphous silicon carbide.

In the photovoltaic device of this invention, the p-layer or n-layer on which light is incident can be comprised of a plurality of sub-layers. In this case, the sub-layer on the i-layer side has an optical forbidden band gap greater than that of the sub-layer on which light is incident.

The photovoltaic device of this invention can achieve an improved open circuit voltage, short circuit current density and conversion efficiency over those of the conventional photovoltaic device.

BRIEF DESCRIPTION OF THE DRAWINGS

FIG. 4 is an energy band diagram of the solar cell of FIG. 3; and

FIG. 5 is an I-V chart of the solar cell of FIG. 3.

DETAILED DESCRIPTION OF THE PREFERRED EMBODIMENT

Figure 1:
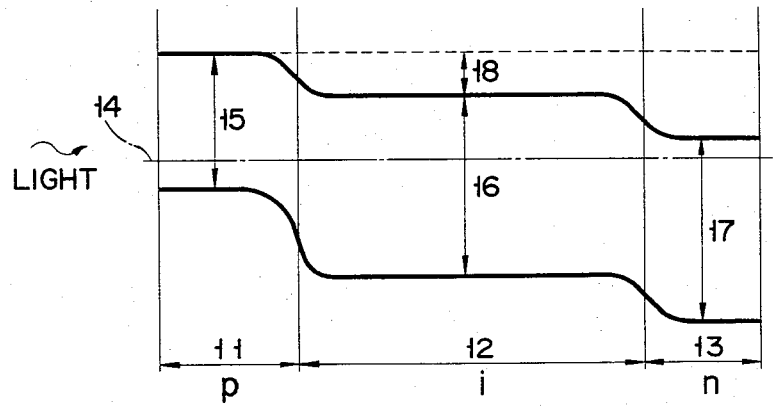
FIG. 1 is an energy band diagram of a conventional p-i-n type solar cell made up of an a-Si layer structure.
Figure 2:
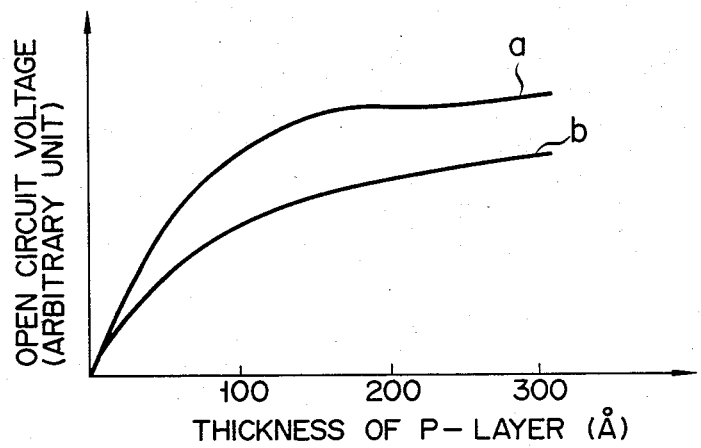
FIG. 2 is a graph showing the relationship of a voltage Voc to the thickness of a p-layer of a conventional p-i-n type solar cell.
Figure 3:
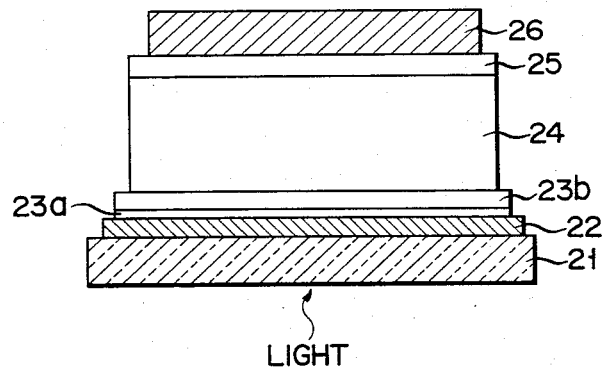
FIG. 3 is a cross-sectional view showing a p-i-n type solar cell according to one embodiment of this invention.

FIG. 3 is a cross-sectional view showing a p-i-n type solar cell according to one embodiment of this invention. In FIG. 3, an indium oxide-tin oxide (ITO) layer 22 having a thickness of 600 to 800 Å, in this case 700 Å, is formed on a glass substrate 21 and a p-i-n type a-Si layer structure is formed on the resultant structure. The a-Si layer structure is comprised of a p-layer 23 having a thickness of 70 to 150 Å, in this case, 120 Å, an i-layer 24 having a thickness of 3,000 to 10,000 Å, in this case, 5000 Å and an n-layer 25 having a thickness of 70 to 5,000 Å, in this case, 500 Å. The p-layer 23 is made up of a first p-sublayer 23a having an Eg of 1.5 to 1.9 eV, in this case, 1.6 eV and a thickness of 20 to 50 Å, in this case, 50 Å, and a second p-sublayer 23b having an Eg of 1.6 to 2.0 eV, in this case, 1.8 eV and a thickness of 50 to 100 Å, in this case 100 Å. An about 10,000 Å-thick ohmic electrode 26 made of, for example, aluminum is formed on the n-layer 25.

In the solar cell so formed, the p-layer on the side on which light falls is comprised of the first p-sublayer 23a and second p-sublayer 23b, and the Eg of the second p-sublayer 23b is chosen to be greater than that of the first p-sublayer 23a. When the p-layer 23 is formed by decomposing a $B_2H_6$-bearing $SiH_4$ in a glow discharge, the adjustment of the Eg can be carried out by controlling the temperature Ts of the substrate, the ratio of $B_2H_6$ to $SiH_4$, and the gas pressure. In this case, the higher the temperature Ts, $B_2H_6/SiH_4$ molar ratio, and gas pressure, the smaller the optical forbidden band gap Eg. It is necessary that when, for example, the first p-sublayer 23a having an Eg of 1.6 eV is to be formed, the temperature Ts and $B_2H_6/SiH_4$ molar ratio be made 250° C. and not less than 0.01, respectively. If the second p-sublayer 23b having an Eg of 1.8 eV is to be obtained, it is necessary to make the temperature Ts and $B_2H_6/SiH_4$ molar ratio 220° C. and less than 0.01, respectively. In either case, the following conditions must be met:

power density: 17 mW/cm$^2$
gas pressure: 1.0 Torr
total gas flow rate: 100 standard cm$^3$/mim The substrate temperature is readily controllable using an infrared ray lamp.

FIG. 4 is an energy band diagram of the p-i-n type solar cell of FIG. 3. As is evident from FIG. 4, the Eg 15b of the second p-sublayer 23b is greater than the Eg 15a of the first p-sublayer 23a.

Table 1 below shows the comparison data of the short circuit current density Jsc and conversion efficiency η which were obtained from the p-layer 23 (Example 1) comprised of a first p-sublayer 23a having an Eg of 1.6 eV and a second p-sublayer 23b having an Eg of 1.8 eV, a p-layer (control 1) comprised of a single layer having an Eg of 1.6 eV and a p-layer (control 2) comprised of a single layer having an Eg of 1.8 eV. In either case, the film thickness of the p-layer was so selected that the Voc is 0.8 V.

TABLE 1

| | film thickness of p-layer (Å) | Jsc (mA/cm$^2$) | η (%) |
|---|---|---|---|
| Example 1 | first p-sublayer 20 second p-sublayer 100 | 13.2 | 6.2 |
| Control 1 | 100 | 11.5 | 5.3 |
| Control 2 | 180 | 10.7 | 5.1 |

As is evident from Table 1, the solar cell of this invention exhibits an excellent performance over that of the conventional solar cell.

FIG. 5 shows the I-V characteristic of the solar cells. In FIG. 5, the curve a corresponds to the solar cell of Example 1 and the curve b corresponds to the solar cell of Control 2. From the graph of FIG. 5 it can be seen that the solar cell of this invention has a higher current and voltage than the conventional solar cell.

Table 2 below shows the comparison data of the various characteristics of solar cells according to examples 2 to 4 and Control 3 when the Eg of the first and second p-sublayers was varied in a variety of ways.

TABLE 2

| | | thickness (Å) | Eg (eV) | Deposition condition substrate temperature | $B_2H_6/SiH_4$ |
|---|---|---|---|---|---|
| Example 2 | first p-sublayer | 30 | 1.7 | 250 | 0.01 |
| | second p-sublayer | 60 | 1.8 | 250 | 0.003 |
| Control 3 | first p-sublayer | 30 | 1.7 | 250 | 0.01 |
| | second p-sublayer | 60 | 1.65 | 250 | 0.02 |
| Example 3 | first p-sublayer | 30 | 1.7 | 250 | 0.01 |
| | second p-sublayer | 60 | 1.75 | 250 | 0.005 |
| Example 4 | first p-sublayer | 30 | 1.7 | 250 | 0.01 |
| | second p-sublayer | 60 | 1.85 | 250 | 0.001 |

The other conditions:
power density 17 mW/cm$^2$
gas pressure 1.0 Torr
total gas flow rate 100 standard cm$^3$/min

TABLE 3

| | Jsc (mA/cm$^2$) | Voc(V) | Fill Factor | η (%) |
|---|---|---|---|---|
| Example 2 | 12.5 | 0.83 | 0.621 | 6.44 |
| Control 3 | 8.4 | 0.76 | 0.536 | 3.42 |
| Example 3 | 12.0 | 0.83 | 0.619 | 6.16 |
| Example 4 | 12.9 | 0.83 | 0.617 | 6.61 |

From Table 3 it can be appreciated that when the Eg of the second p-sublayer is greater than that of the first p-sublayer (Examples 2 to 4) excellent characteristics are obtained in either case and that when, on the other hand, the Eg of the second p-sublayer is smaller than that of the first sub-layer (Control 3) poor characteristics are obtained.

Although an explanation has been made of the case where the p-layer exists on the light-incident side of the p-i-n structure, the n-layer may be constructed of a plurality of sublayers each having a different Eg with the n-layer on the light-incident side. In this case it is preferred that a first n-sublayer have a thickness of 20 to 50 Å and an Eg of 1.6 to 2.0 eV and that a second n-sublayer have a thickness of 50 to 100 Å and an Eg of 1.7 to 2.1 eV. Although Examples using the hydrogenated a-Si layer structure have been described, it is also possible to use a hydrogenated a-SiC layer structure. In this case, it is also possible to use an a-Si layer as the first p-sublayer and an a-SiC layer as the second p-sublayer. It should be noted that the hydrogenated a-SiC can be readily formed by decomposing a gaseous mixture of $SiH_4$ and hydrocarbon gas, such as $CH_4$ and $C_2H_4$ in a glow discharge.

Where the hydrogenated a-SiC layer structure is used in place of the hydrogenated a-Si layer structure, it is preferred that the first p-sublayer have a thickness of 20 to 50 Å and an Eg of 1.7 to 2.2 eV, that the second p-sublayer have a thickness of 50 to 100 Å and an Eg of 1.8 to 2.4 eV, that the first n-sublayer have a thickness of 20 to 50 Å and an Eg of 1.7 to 2.2 eV, and that the second n-sublayer have a thickness of 50 to 100 Å and an Eg of 1.8 to 2.4 eV.

Although this invention has been explained with respect to the layer structure having two p- or n-sublayers, a layer structure having three or more sublayers may be provided in which their Eg's are gradually increased toward the i-layer side.

What is claimed is:
1. A photovoltaic device comprising a transparent substrate, an amorphous silicon layer structure of a p-i-n type formed on the substrate and comprised of a p-layer, i-layer and n-layer, and an electrode formed on the amorphous silicon layer, in which, of said p-layer and said n-layer of the amorphous silicon layer structure, that layer on which light is incident is constituted such that the optical forbidden band gap is greater on the i-layer side than on the substrate side.

2. A photovoltaic device according to claim 1, in which said amorphous silicon layer structure is made of hydrogenated amorphous silicon.

3. A photovoltaic device according to claim 2, in which that layer on which light is incident is a p-layer.

4. A photovoltaic device according to claim 3, in which said p-layer is comprised of a plurality of sublayers each having a different optical forbidden band gap.

5. A photovoltaic device according to claim 3, in which said p-layer is comprised of a first p-sublayer in contact with said substrate and a second p-sublayer in contact with said i-layer.

6. A photovoltaic device according to claim 5, in which said first p-sublayer has a thickness of 20 to 50 Å and an optical forbidden band gap of 1.5 to 1.9 eV, and said second p-sublayer has a thickness of 50 to 100 Å and an optical forbidden band gap of 1.6 to 2.0 eV.

7. A photovoltaic device according to claim 2, in which that layer on which light is incident is an n-layer.

8. A photovoltaic device according to claim 7, in which said n-layer is comprised of a plurality of sublayers each having a different optical forbidden band gap.

9. A photovoltaic device according to claim 8, in which said n-layer is comprised of a first n-sublayer in contact with said substrate and a second n-sublayer in contact with said i-layer.

10. A photovoltaic device according to claim 9, in which said first n-sublayer has a thickness of 20 to 50 Å and an optical forbidden band gap of 1.6 to 2.0 eV and said second n-sublayer has a thickness of 50 to 100 Å and an optical forbidden band gap of 1.7 to 2.1 eV.

11. A photovoltaic device according to claim 1, in which said amorphous silicon layer structure is made of amorphous silicon carbide.

12. A photovoltaic device according to claim 1, in which said p or n type amorphous silicon layer on which light is incident is comprised of a two-layer structure in whic one sublayer is made of hydrogenated amorphous silicon and the other sublayer is made of amorphous silicon carbide.

13. A photovoltaic device according to claim 1, in which said transparent substrate has a transparent electrode contacting the amorphous silicon layer structure.

14. A photovoltaic device according to claim 13, in which said transparent electrode is made of an indium oxide-tin oxide layer.

15. A photovoltaic device comprising an amorphous silicon layer structure comprised of a p-layer, i-layer and n-layer, in which, of said p-layer and said n-layer, that layer on which light is incident is such that the optical forbidden band gap is greater on the i-layer side than on the light incident side.

* * * * *